United States Patent
Eguchi et al.

(10) Patent No.: US 7,599,236 B2
(45) Date of Patent: Oct. 6, 2009

(54) IN-CIRCUIT VT DISTRIBUTION BIT COUNTER FOR NON-VOLATILE MEMORY DEVICES

(75) Inventors: Richard K. Eguchi, Austin, TX (US); Larry J. Grieve, Austin, TX (US); Thomas Jew, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 60 days.

(21) Appl. No.: 11/448,225

(22) Filed: Jun. 7, 2006

(65) Prior Publication Data

US 2007/0285986 A1 Dec. 13, 2007

(51) Int. Cl.
*G11C 29/00* (2006.01)

(52) U.S. Cl. ............ 365/201; 365/185.24; 365/185.03; 365/185.18

(58) Field of Classification Search ................. 365/201, 365/185.24, 185.03, 185.18
See application file for complete search history.

(56) References Cited

U.S. PATENT DOCUMENTS

| | | | |
|---|---|---|---|
| 6,188,615 B1* | 2/2001 | Perner et al. ................ | 365/158 |
| 6,226,200 B1 | 5/2001 | Eguchi et al. | |
| 6,529,413 B2* | 3/2003 | Lee et al. ................ | 365/185.22 |
| 2002/0196672 A1* | 12/2002 | Honma et al. .......... | 365/189.11 |
| 2005/0270842 A1* | 12/2005 | Furuta et al. ........... | 365/185.09 |
| 2006/0168491 A1* | 7/2006 | Lee et al. .................... | 714/733 |
| 2007/0025167 A1* | 2/2007 | Ziegelmayer et al. ....... | 365/201 |
| 2007/0159891 A1* | 7/2007 | Tu et al. ................ | 365/185.24 |
| 2008/0104459 A1* | 5/2008 | Uchikawa et al. ........... | 714/721 |

* cited by examiner

*Primary Examiner*—Vu A Le
*Assistant Examiner*—Han Yang
(74) *Attorney, Agent, or Firm*—Dillon & Yudell LLP

(57) ABSTRACT

Integrated testing components and testing algorithm on a non-volatile memory module provide faster Vt (threshold voltage) distributions during the module verification process. The memory module includes address and voltage scanning components and a bit counter for storing the number of 0's or 1's for a specified voltage. As the range of addresses are scanned across a range of voltages, the instances of the count value being counted is accumulated by the bit counter. Automated Tester Equipment (ATE) reads the accumulated count value for each tested voltage.

8 Claims, 4 Drawing Sheets

IN-CIRCUIT VT DISTRIBUTION BIT COUNTER FOR NON-VOLATILE MEMORY DEVICES

BACKGROUND OF THE INVENTION

1. Field of the Invention

The invention relates generally to non-volatile memory devices, and particularly to an improved method and apparatus for testing non-volatile memory devices.

2. Description of the Related Art

Non-volatile memory refers generally to all forms of solid state memory that does not need to have its memory contents periodically refreshed. Common examples include all forms of read-only memory (ROM) such as programmable read-only memory (PROM), erasable programmable read-only memory (EPROM), electrically erasable programmable read-only memory (EEPROM), and flash memory.

Flash memory is a variation of EEPROM that is erased and rewritten in blocks instead of at the byte level. Flash memory is increasingly being used in digital cellular telephones, digital cameras, LAN switches, PC cards for laptop computers, digital set-top boxes, embedded controllers, and other devices.

The data in flash memory is stored in memory elements addressed by a row line and column line. Each memory element contains a charge storage structure, such as a floating gate. The amount of charge in the charge storage structure determines the logical state of the memory element. If the amount of charge stored is greater than a pre-defined threshold, the logical value stored in the memory element is a logical value of 0; otherwise, the memory element contains a logical value of 1.

In order to deliver zero defect products, manufactures utilize Vt (threshold voltage) distributions to identify bits that don't meet threshold voltage specifications ("maverick bits") as well as the healthiness of the manufacturing process. The Vt distributions are obtained by Automated Tester Equipment (ATE) by applying a specific voltage to the flash module and counting the number of cells with a value of 0 or 1. The process is repeated for a range of voltages to determine the Vt distribution for the module. For each cell during each cycle, the ATE must read and accumulate the cell values. The data transfer from the flash module to the ATE is very slow and acts as a bottleneck during the module verification process.

Moreover, the creation of high density and high performance flash modules allowed by improvements in design and manufacturing has increased module sizes such that they require an even greater amount of testing to be performed on the module and data exchange between the module and the ATE. Using current methods of testing, a 2 megabyte flash module will take between 10 to 15 minutes to collect a Vt distribution. As module densities increase, module test times will also increase. Therefore, there exists a need for a new and improved method and system for threshold voltage testing to more effectively accommodate high density memory modules.

BRIEF DESCRIPTION OF THE DRAWINGS

This invention is described in a preferred embodiment in the following description with reference to the drawings, in which like numbers represent the same or similar elements, as follows.

In the following detailed description of exemplary embodiments of the invention, reference is made to the accompanying drawings, which form a part hereof, and in which is shown by way of illustration of specific exemplary embodiments in which the invention may be practiced.

DETAILED DESCRIPTION OF PREFERRED EMBODIMENTS

In the following detailed description of exemplary embodiments of the invention, specific exemplary embodiments in which the invention may be practiced are described in sufficient detail to enable those skilled in the art to practice the invention, but it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims. In particular, although the preferred embodiment is described below with respect to a non-volatile flash memory module, it will be appreciated that the present invention is not so limited and that it has application to collect Vt (threshold voltage) distributions in other embodiments of memory devices, including programmable read-only memory (PROM), erasable programmable read-only memory (EPROM), and electrically erasable programmable read-only memory (EEPROM).

Figure 1:
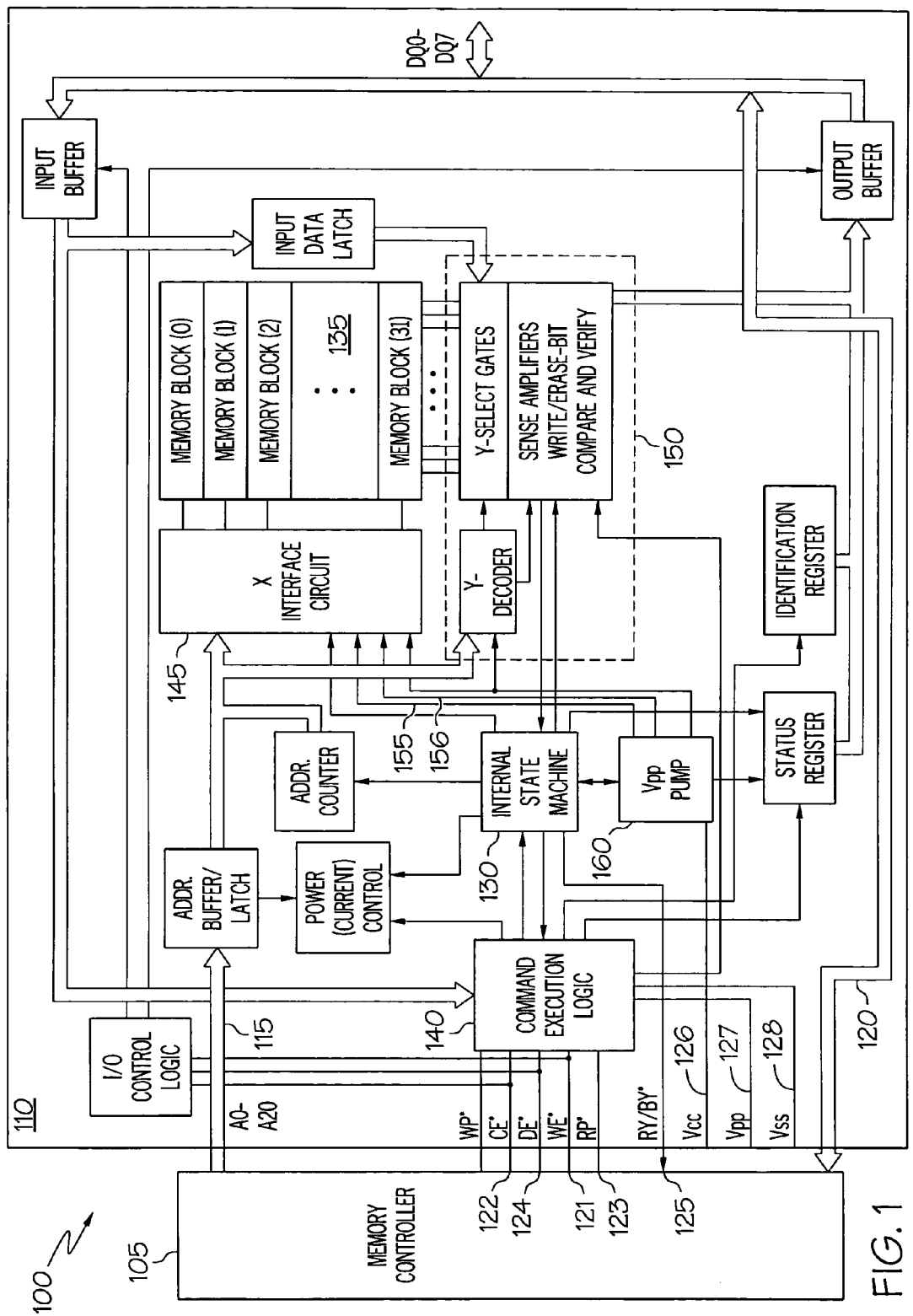
FIG. 1 is a schematic diagram of a memory system according to an embodiment of the present invention.

With reference now to the figures, and in particular with reference to FIG. 1, there is shown a schematic diagram illustrating, by way of example, but not by way of limitation, one embodiment of a memory system 100 wherein the present invention is utilized. The memory system 100 includes a memory controller 105 and a memory integrated circuit (IC) 110.

The controller 105 includes a control device such as a microprocessor to provide interface signals to the IC 110. The interface signals include address signals provided over multiple address lines 115, and data signals communicated over multiple data lines 120. Other interface signals provided by the controller 105 include a write enable signal WE* at node 121, a chip enable signal CE* at node 122, a reset/power-down signal RP* at node 123, and an output enable signal OE* at node 124, all of which are active low signals.

The IC 110 provides a status signal RY/BY* to the controller 105 at node 125 to indicate the status of an internal state machine 130. The IC 110 also receives a positive power supply voltage $V_{CC}$ at node 126, a write/erase supply (or programming) voltage $V_{PP}$ at node 127, and a reference voltage such as a substrate ground voltage $V_{SS}$ at node 128 which is approximately 0 Volts.

The IC 110 includes an array 135 of floating gate transistor memory cells arranged in 32 memory cell blocks. Each block in the array 135 contains 64 kilobytes of floating gate transistor memory cells. Data stored in each block is erased independently without disturbing data stored in other blocks.

A command execution logic module 140 receives the above-described interface signals from the controller 105. The module 140 controls the state machine 130 which provides write and block erase timing sequences to the array 135 through an X-interface circuit 145 and a Y-interface circuit 150.

The Y-interface circuit 150 provides access to individual memory cells through data lines in the array 135. Data lines in the Y-interface circuit 150 are connected to a bit line driver circuit (not shown). The Y-interface circuit 150 includes a Y-decoder circuit, Y-select gates, sense-amplifiers, and write/erase bit compare and verify circuits.

The X-interface circuit 145 provides access to rows of memory cells through word lines in the array 135, which are electrically coupled to control gates of the cells in the array 135. The X-interface circuit 145 includes decoding and control circuits for erasing individual blocks of the cells in the array 135.

The components illustrated in FIG. 1 are one example of a memory system in which the present invention may be implemented and is intended to show in a general sense, and not a limiting one, a system in which the present invention is useful.

Figure 2:
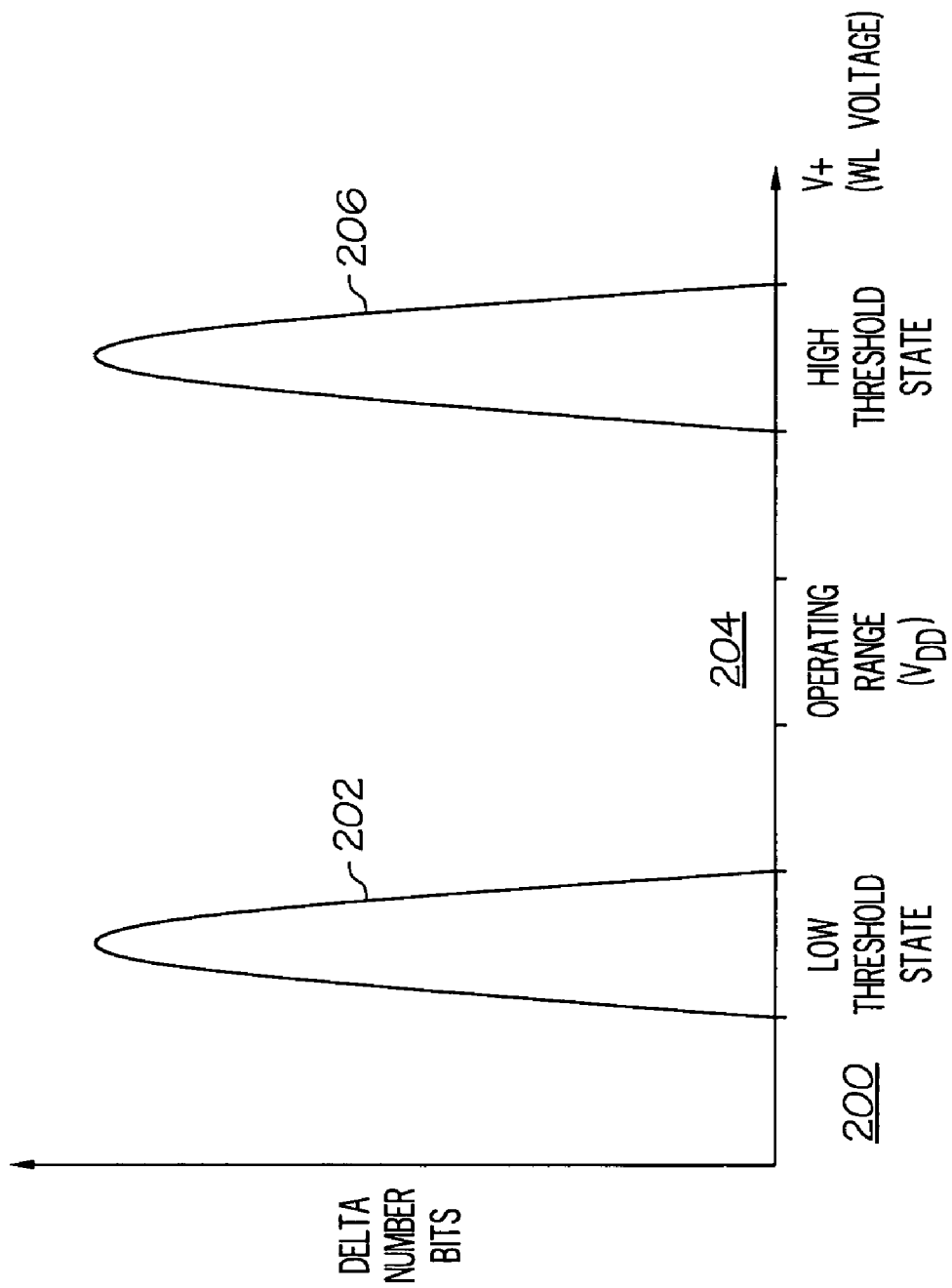
FIG. 2 is a diagram showing the distribution of the bit cells' threshold voltages (Vt) with respect to word line voltages.

With reference now to FIG. 2, there is a diagram showing generally desired distribution curves 200 of the bit cells' Vt with respect to word line voltages. The operating range 204 is the voltage that is applied to a bit cell control gate during normal read operations. Bit cells in the high threshold state or programmed state reside in the distribution of curve 206, and bit cells in the low threshold state or erased state reside in the distribution of curve 202. The minimum of the high threshold state is separated from a maximum of an operating range 204 to insure reliable reads of bit cells in the high threshold state. The maximum of the low threshold state is separated from a minimum of the operating range 204 to insure reliable reads of bit cells in the low threshold state.

During the testing phase of memory devices, external testers collect Vt distributions to provide zero-defect products and to examine the healthiness of the production process. If the Vt distribution for a memory device contains maverick bits, ones that would show in the Operating Range 204 in FIG. 2, then the tester is designed to alert the manufacturer to a product defect and potential problem in the production process.

Figure 3:
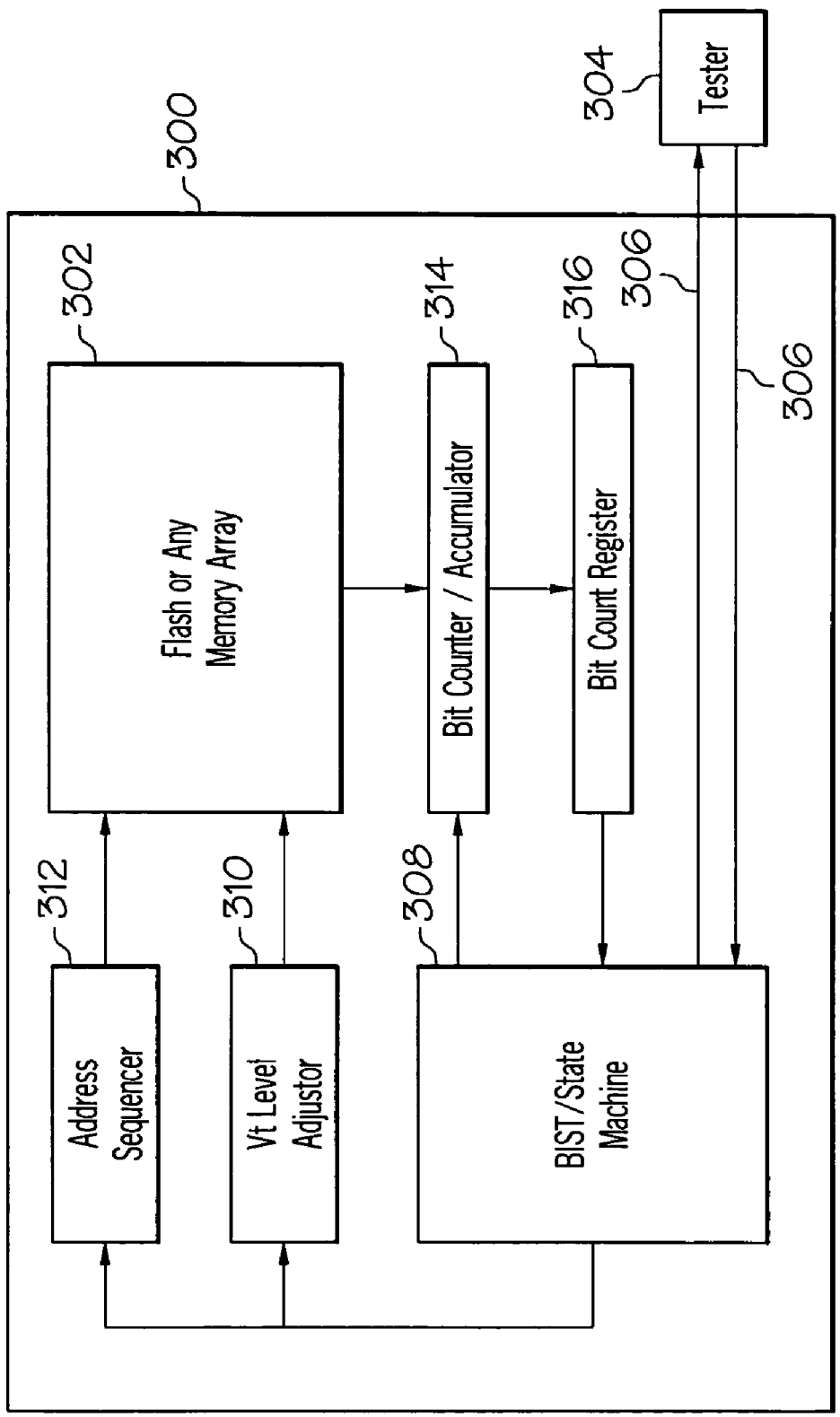
FIG. 3 is a block diagram for a non-volatile memory module in accordance with a preferred embodiment of the present invention.
Figure 4:
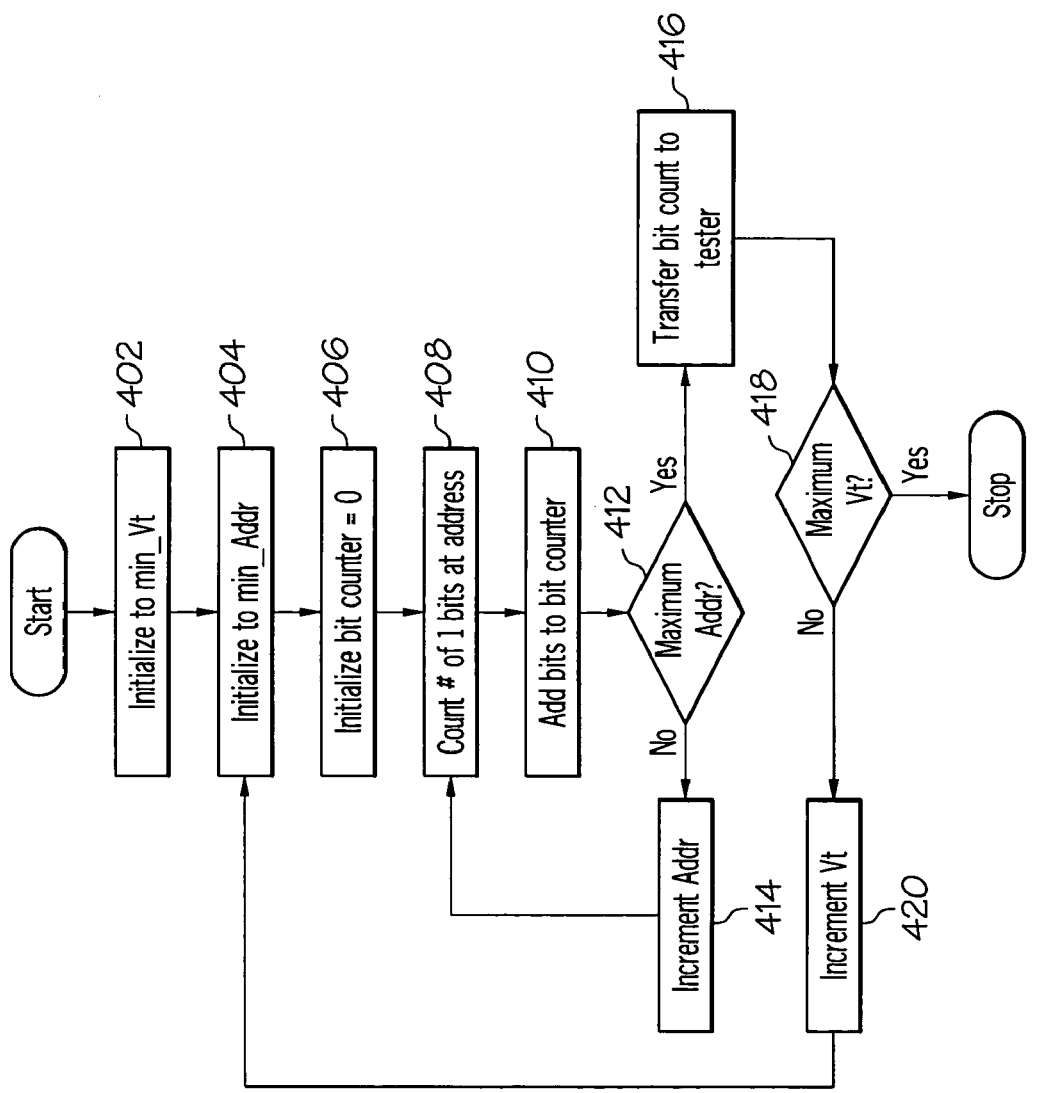
FIG. 4 is a flow diagram for obtaining a Vt distribution of a non-volatile memory module in accordance with a preferred embodiment of the present invention.

FIG. 3 and FIG. 4 illustrate in more detail a method, system, and memory module for more efficiently collecting Vt distributions in accordance with a preferred embodiment of the present invention.

With reference now to FIG. 3, there is shown a block diagram of a non-volatile memory module in accordance with a preferred embodiment of the present invention wherein an in-circuit threshold voltage (Vt) distribution is collected. In accordance with the invention, the components for testing the non-volatile memory is integrated on to a single chip with the non-volatile memory itself.

Non-volatile memory (NVM) 300 includes Input/Output Lines 306 for connecting NVM 300 to Automated Tester Equipment (ATE) 304. During the verification process of NVM 300, ATE 304 is utilized to obtain a Vt distribution. Specifically, NVM 300 communicates to ATE 304 the value from Bit Count Register 316.

NVM 300 includes Memory Array 302 to store binary data. Those skilled in the art will readily appreciate that Memory Array 302 may be structured as a single block of data storage or multiple linked blocks of data storage without departing from the spirit and scope of the present invention.

In accordance with a preferred embodiment of the present invention, NVM 300 includes Built-In Self Test (BIST) 308. BIST 308 comprises computer program code or hardware logic to control the collection of the Vt distribution from Memory Array 302. Specifically, BIST 308 controls Vt Level Adjustor 310, Address Sequencer 312, and Bit Count Register 316 to provide a Vt distribution to ATE 304. The steps performed by BIST 308 are described in more detail in conjunction with FIG. 4.

During the collection of the Vt distribution, BIST 308 utilizes Vt Level Adjuster 310 to apply a specific voltage to Memory Array 302. The voltage outputted by Vt Level Adjuster 310 is applied to a specific address in Memory Array 302 by Address Sequencer 312. BIST 308 cycles Vt Level Adjustor through a range of test voltages to apply to Memory Array 302. In a preferred embodiment, Vt Level Adjustor 310 is initialized to a minimum test voltage and incremented in steps to a maximum test voltage. In other embodiments, the test voltage is set to a maximum and decreased in steps to a minimum voltage. Those skilled in the art will readily appreciate that the order of the test voltages may be random or any other pattern without departing from the spirit and scope of the invention.

The number of 0's or 1's from Memory Array 302 is counted by Bit Counter/Accumulator 314 as BIST 308 controls Address Sequencer 312 to scan through the address range, or a portion thereof, of Memory Array 302. The value that is counted (0 or 1) is called the search value. The accumulated count is stored in Bit Count Register 316 where it is accessed by BIST 308. ATE 304 accesses BIST 308 (or in alternative embodiments, Bit Count Register 316) through input/output lines 306.

In a preferred embodiment, Address Sequencer 312 begins cycling through Memory Array 302 at a minimum address and sequentially advances through each address in Memory Array 302; however any sequence of addresses may be generated by Address Sequencer 312 without departing from the scope of the invention.

With reference now to FIG. 4, there is a flow diagram of a process of a preferred embodiment of the present invention to more efficiently obtain Vt distributions for non-volatile memory modules. In particular, the flow diagram depicts the process of accumulating a bit count for a specific Vt level within the memory module, and then communicating the bit count to an external tester. By accumulating the bit count internally, the impact of the I/O bottleneck between the external testing equipment and memory module is significantly reduced.

The Vt distribution collection process begins with control passing to Vt Initialization Block 402. During the step of Vt Initialization Block 402, BIST 308 sets Vt Level Adjustor 310 to a first test voltage. In a preferred embodiment, the first test voltage is the minimum Vt level to be tested.

The process then advances to Address Initialization Block 404 where BIST 308 sets Address Sequencer 312 to address the first address in Memory Array 302. Those skilled in the art will readily appreciate that Memory Array 302 may be scanned in other patterns, including from highest address or randomly, without departing from the spirit and scope of the invention.

Following the address initialization, the process moves to Bit Counter Initialization Block 406. At the step of Bit Counter Initialization Block 406, BIST 308 sets Bit Counter 314 to zero, preparing it to accumulate the number 1's for the current Vt level. Those skilled in the art will recognize that the number of 0's (search value=0) could also be counted without departing from the spirit and scope of the present invention.

The process then proceeds to Step 408, where Bit Counter/Accumulator 314 counts the number of 1's at the address specified by Address Sequencer 312. The value from Bit Counter Block 314 is then added to Bit Count Register 316 in Step 410.

After Bit Count Register 316 is updated in Step 410, the process passes to Step 412, where BIST 308 determines if the current address is the last address to be tested. In a preferred embodiment, the last address to be tested is the maximum address of the memory module. If the address is not the last address, then the process moves to Step 414 where Address Sequencer 312 increments the current address to the next available address. The process then repeats through Steps 408, 410, 412, and 414 until it is determined at Step 412 that the maximum address has been reached.

Once the maximum address has been tested as determined in Step 412, the process moves to Step 416 where BIST 308 transfers the value stored in Bit Count Register 316 to ATE 304. Until Step 416 is reached, all actions take place on the memory module, thereby reducing the amount of data transferred over I/O Pins 306 to ATE 304, which yields significant improvements in testing speed.

At Step 418, Vt Level Adjustor 310 determines if the current Vt Level in Vt Level Adjustor 310 is the maximum Vt to be tested. If the current Vt is not the maximum, the process moves to Step 420, where Vt Level Adjustor 310 increases the Vt level to the next test level and begins repeating the process at Step 404. If at Step 418 it is determined the current Vt level is the maximum Vt level, the process ends.

As will be appreciated, the processes in preferred embodiments of the present invention may be implemented using any combination of computer programming software, firmware or hardware. The method form of the invention may be practiced by combining software and/or hardware to complete the steps of the invention.

While the invention has been particularly shown and described with reference to preferred embodiments, it will be understood by those skilled in the art that various changes in form and detail may be made therein without departing from the spirit and scope of the invention. Any variations, modifications, additions, and improvements to the embodiments described are possible and may fall within the scope of the invention as detailed within the following claims.

What is claimed is:

1. A non-volatile memory device comprising:
a built-in self test component within a single chip containing the non-volatile memory device that executes an in-circuit Vt distribution algorithm that tests the non-volatile memory device; and
a bit counter contained within the single chip for counting bit values during the execution of the in-circuit Vt distribution algorithm,
wherein said built-in self test component comprises logic to execute the following steps:
initializing the bit counter to a preset number;
selecting a current Vt level from a plurality of test Vt levels;
initializing the address sequencer with a current memory address from a plurality of addresses;
counting the number of bit values at the current memory address that are equal to a count value to determine an address count; and
adding the address count to the bit counter.

2. The non-volatile memory device of claim 1, wherein said non-volatile memory device further comprises:
a Vt level adjustor for providing a current Vt level; and
an address sequencer for selecting a current memory address during the in-circuit Vt distribution algorithm.

3. A non-volatile memory device comprising:
a built-in self test component within a single chip containing the non-volatile memory device that executes an in-circuit Vt distribution algorithm that tests the non-volatile memory device; and
a bit counter contained within the single chip for counting bit values during the execution of the in-circuit Vt distribution algorithm,
wherein said built-in self test component further comprises logic to execute the following steps:
counting the number of bit values at a current memory address that are equal to a count value to determine an address count; and
adding the address count to the bit counter.

4. A non-volatile memory device comprising:
a built-in self test component within a single chip containing the non-volatile memory device that executes an in-circuit Vt distribution algorithm that tests the non-volatile memory device; and
a bit counter contained within the single chip for counting bit values during the execution of the in-circuit Vt distribution algorithm,
wherein said built-in self test component further comprises logic for transferring the bit counter contents to an external tester.

5. A system for collecting Vt distribution in a memory device, said system comprising:
a bit counter contained within the memory device for counting bit values addressed within the memory device during the execution of an in-circuit Vt distribution algorithm;
a built-in self test within the memory containing logic for executing the in-circuit Vt distribution algorithm;
a Vt level adjustor for providing a current Vt level to memory cells in the memory device; and
an address sequencer for selecting a current memory address within the memory device during the in-circuit Vt distribution algorithm,
wherein said bit counter counts the number of bit values at the current memory address that are equal to a search value to determine an address count and adds the address count to an accumulated count.

6. The system of claim 5, wherein said built-in self test comprises logic to execute the following steps:
initializing the bit counter to zero;
selecting a current Vt level from a plurality of test Vt levels; and
initializing the address sequencer with a current memory address from a plurality of test addresses.

7. A system for collecting Vt distribution in a memory device, said system comprising:
a bit counter contained within the memory device for counting bit values addressed within the memory device during the execution of an in-circuit Vt distribution algorithm;
a built-in self test within the memory containing logic for executing the in-circuit Vt distribution algorithm;
a Vt level adjustor for providing a current Vt level to memory cells in the memory device; and
an address sequencer for selecting a current memory address within the memory device during the in-circuit Vt distribution algorithm,
wherein said built-in self test further comprises logic for transferring the bit counter contents to an external tester.

8. A system for collecting Vt distribution in a memory device, said system comprising:
a bit counter contained within the memory device for counting bit values addressed within the memory device during the execution of an in-circuit Vt distribution algorithm;

a built-in self test within the memory containing logic for executing the in-circuit Vt distribution algorithm;

a Vt level adjustor for providing a current Vt level to memory cells in the memory device wherein the Vt level adjustor provides a current Vt level at each of a plurality of current Vt levels during execution of the in-circuit Vt distribution algorithm; and an address sequencer for selecting a current memory address within the memory device during the in-circuit Vt distribution algorithm, wherein the address sequencer selects a current memory address at each of a plurality of memory addresses during the in-circuit Vt distribution algorithm.

\* \* \* \* \*